United States Patent
Hsu et al.

(10) Patent No.: US 10,962,299 B2
(45) Date of Patent: Mar. 30, 2021

(54) EVAPORATOR STRUCTURE WITH IMPROVED LAYOUT OF COOLING FLUID CHANNELS

(71) Applicant: LDC Precision Engineering CO., Ltd., New Taipei (TW)

(72) Inventors: Chi-Feng Hsu, New Taipei (TW); Cheng-Jen Liang, New Taipei (TW)

(73) Assignee: LDC PRECISION ENGINEERING CO., LTD., New Taipei (TW)

( * ) Notice: Subject to any disclaimer, the term of this patent is extended or adjusted under 35 U.S.C. 154(b) by 203 days.

(21) Appl. No.: 16/186,476

(22) Filed: Nov. 9, 2018

(65) Prior Publication Data
US 2020/0149822 A1    May 14, 2020

(51) Int. Cl.
*F28D 15/02* (2006.01)
*F28D 21/00* (2006.01)
*H01L 23/427* (2006.01)
*H05K 7/20* (2006.01)

(52) U.S. Cl.
CPC .. *F28D 15/0266* (2013.01); *F28D 2021/0064* (2013.01); *H01L 23/427* (2013.01); *H05K 7/20309* (2013.01)

(58) Field of Classification Search
CPC ......... F28D 15/0266; F28D 2021/0064; H01L 23/427; H05K 7/20309
USPC ...................... 165/104.21; 361/700
See application file for complete search history.

(56) References Cited

U.S. PATENT DOCUMENTS

| | | | | |
|---|---|---|---|---|
| 7,762,314 | B2* | 7/2010 | Campbell | F28F 3/02 165/80.3 |
| 7,836,597 | B2* | 11/2010 | Datta | F28D 15/0266 29/890.041 |
| 9,453,691 | B2* | 9/2016 | Lyon | F28D 15/00 |
| 9,778,709 | B2* | 10/2017 | So | G06F 1/20 |
| 9,795,058 | B2* | 10/2017 | Tsai | G06F 1/20 |
| 10,443,960 | B2* | 10/2019 | Wan | F28F 13/08 |
| 2004/0075181 | A1* | 4/2004 | Hara | F28D 15/043 261/99 |
| 2007/0272392 | A1* | 11/2007 | Ghosh | H01L 23/4336 165/80.4 |
| 2008/0164010 | A1* | 7/2008 | Kang | F28D 15/046 165/104.26 |

(Continued)

*Primary Examiner* — Paul Alvare
(74) *Attorney, Agent, or Firm* — Chun-Ming Shih; Lanway IPR Services

(57) ABSTRACT

An evaporator structure with improved layout of cooling fluid channels includes a heat exchange component, a thermal conductive shell and a top cap. The heat exchange component is accommodated in the thermal conductive shell; the top cap mounted on the thermal conductive shell encloses the heat exchange component; the heat exchange component includes a plurality of transverse channels thereon, two first lengthwise cooling fluid channels near two side edges at the bottom respectively and a plurality of minor second lengthwise cooling fluid channels near the center. When the thermal conductive shell is heated, cooling fluids flowing to first lengthwise cooling fluid channels at both sides through transverse channels are guided into second lengthwise cooling fluid channels via the first lengthwise cooling fluid channels and the transverse channels and distributed throughout heat sources uniformly for full-area heat dissipation.

6 Claims, 7 Drawing Sheets

(56) References Cited

U.S. PATENT DOCUMENTS

2008/0216991 A1* 9/2008 Oikawa .................... G06F 1/20
165/80.3

* cited by examiner

EVAPORATOR STRUCTURE WITH IMPROVED LAYOUT OF COOLING FLUID CHANNELS

BACKGROUND OF THE INVENTION

1. Field of the Invention

The present disclosure relates to an evaporator structure, which relies on cooling fluids for internal air-liquid conversion and sufficient heat dissipation based on specific fluid channels in design.

2. Description of Related Art

The heat productivity of a heat generation device is getting higher continuously because of advanced semiconductor process technologies in recent years. In this regard, how to promote heat dissipation of a heat generation device and keep normal functions of a component is a critical engineering issue. Moreover, engineers should find other solutions when prevalent direct air-cooling techniques come short of the capacity to dissipate heat from more and more heat generation devices with the high heat flux.

In addition to the air-cooling technique customarily adopted right now, an alternative technique based on cooling fluids for air-liquid conversion and heat dissipation includes two groups of thermal spreaders with two sets of pipelines interconnected. One group of thermal spreaders are used in evaporation and removal of absorbed heat and the other group of thermal spreaders are applicable in condensing/cooling hot air and returning cooling fluids for the heat dissipation cycle. However, each of two groups of thermal spreaders sustaining specific internal pressures to return cooling fluids automatically comprises ordinary cooling fins or channels mostly for circulations of cooling fluids inside and racks up heat at specific locations at which some adverse conditions are observed such as high evaporation, low water level, locally high temperature, unstable/uneven heat dissipation and abrupt decreasing service life.

SUMMARY OF THE INVENTION

An evaporator structure comprises at least: a heat exchange component, which is divided into a steam region and an inflow water region and comprises a partition wall between the steam region and the inflow water region, a plurality of parallel and penetrated transverse channels inside, a lengthwise top water inlet channel near the top center of the inflow water region, and a plurality of lengthwise steam channels near the top center of the steam region wherein the lengthwise top water inlet channel and the lengthwise steam channels are not interconnected with each other due to a design of the partition wall, the lengthwise top water inlet channel (the lengthwise steam channels) is (are) perpendicular with the transverse channels, the lower portions of the steam region, the inflow water region and the partition wall are penetrated by two first lengthwise cooling fluid channels designed at the bottom and near two side edges of the heat exchange component, the first lengthwise cooling fluid channels penetrate two bottom edges of the heat exchange component, the steam region comprises a plurality of second lengthwise cooling fluid channels kept close to the center at the bottom and extending from one side to the partition wall for the length equal to those of the lengthwise steam channels, the lengthwise top water inlet channel and the inflow water region are not interconnected with each other due to the partition wall, each second lengthwise cooling fluid channel is less than each first lengthwise cooling fluid channel in length, and the second lengthwise cooling fluid channels are staggered with the lengthwise steam channels; a thermal conductive shell in which the heat exchange component is accommodated; a top cap covering the thermal conductive shell and comprising a steam outlet and a water inlet opened exteriorly and being opposite to one of the lengthwise steam channels and the lengthwise top water inlet channel, respectively.

In a preferred embodiment, the heat exchange component is an integrated component.

In a preferred embodiment, the steam region is greater than the inflow water region in area, the lengthwise top water inlet channel extends from one side to the partition wall, the lengthwise steam channels extend from one side to the partition wall, and each lengthwise steam channel is greater than the lengthwise top water inlet channel in length.

In a preferred embodiment, the lengthwise steam channels of the heat exchange component are equal to the second cooling fluid channels in length.

In a preferred embodiment, the lengthwise steam channels near the center of the steam region extend from one side edge to the partition wall, the lengthwise top water inlet channel extends from one side edge to the partition wall, and the lengthwise steam channels and the second lengthwise cooling fluid channels of the heat exchange component are not interconnected with each other due to the partition wall.

In a preferred embodiment, the second lengthwise cooling fluid channels near the center of the steam region extend from one side edge to the partition wall, the lengthwise top water inlet channel extends from one side edge to the partition wall, and the lengthwise steam channels and the second lengthwise cooling fluid channels of the heat exchange component are not interconnected with each other due to the partition wall.

DETAILED DESCRIPTION OF THE PREFERRED EMBODIMENTS

The technical details, features and effects of an evaporator structure are presented in preferred embodiments and accompanying drawings clearly.

Figure 1:
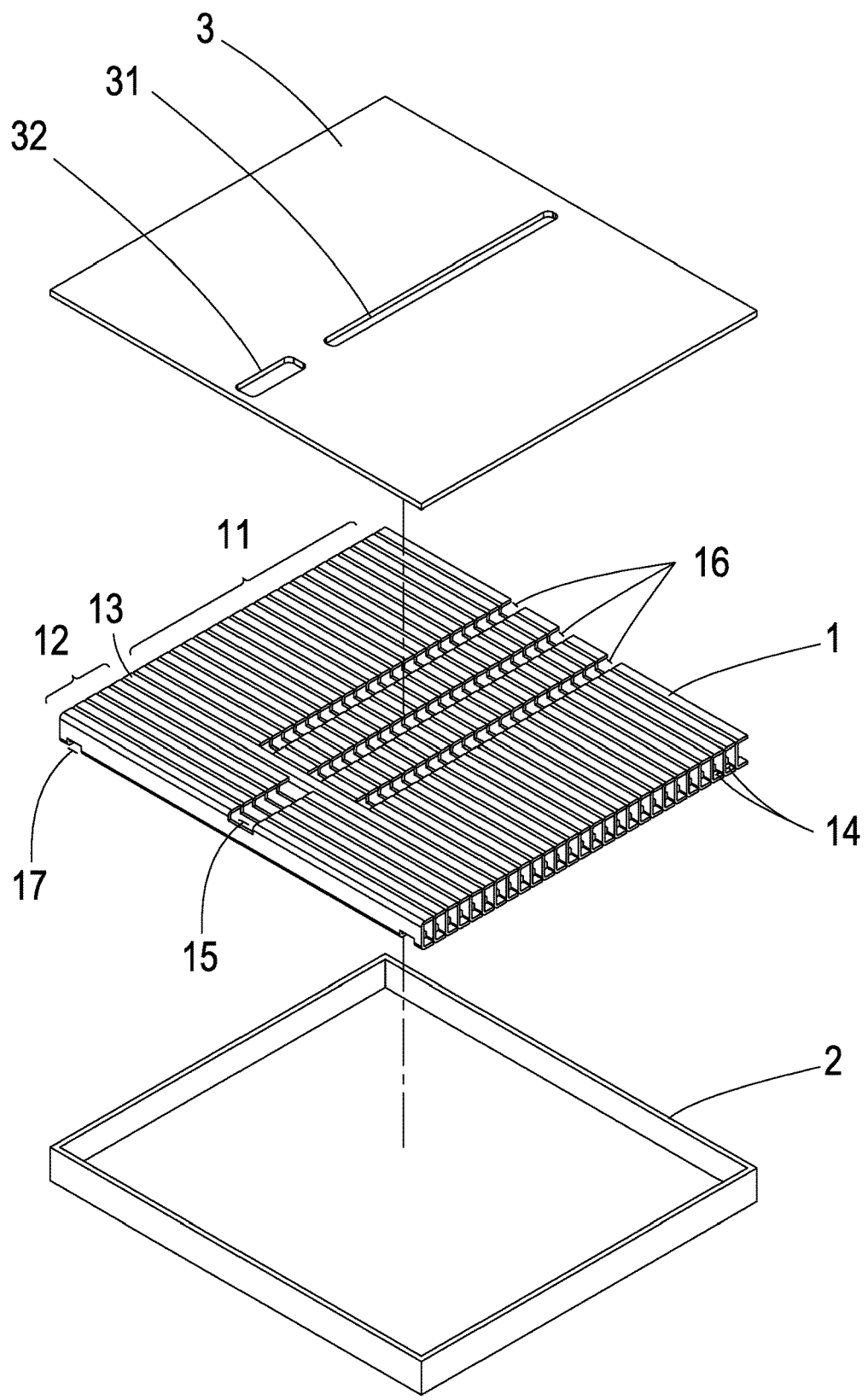
FIG. 1 is an exploded perspective schematic view of an evaporator structure.
Figure 2:
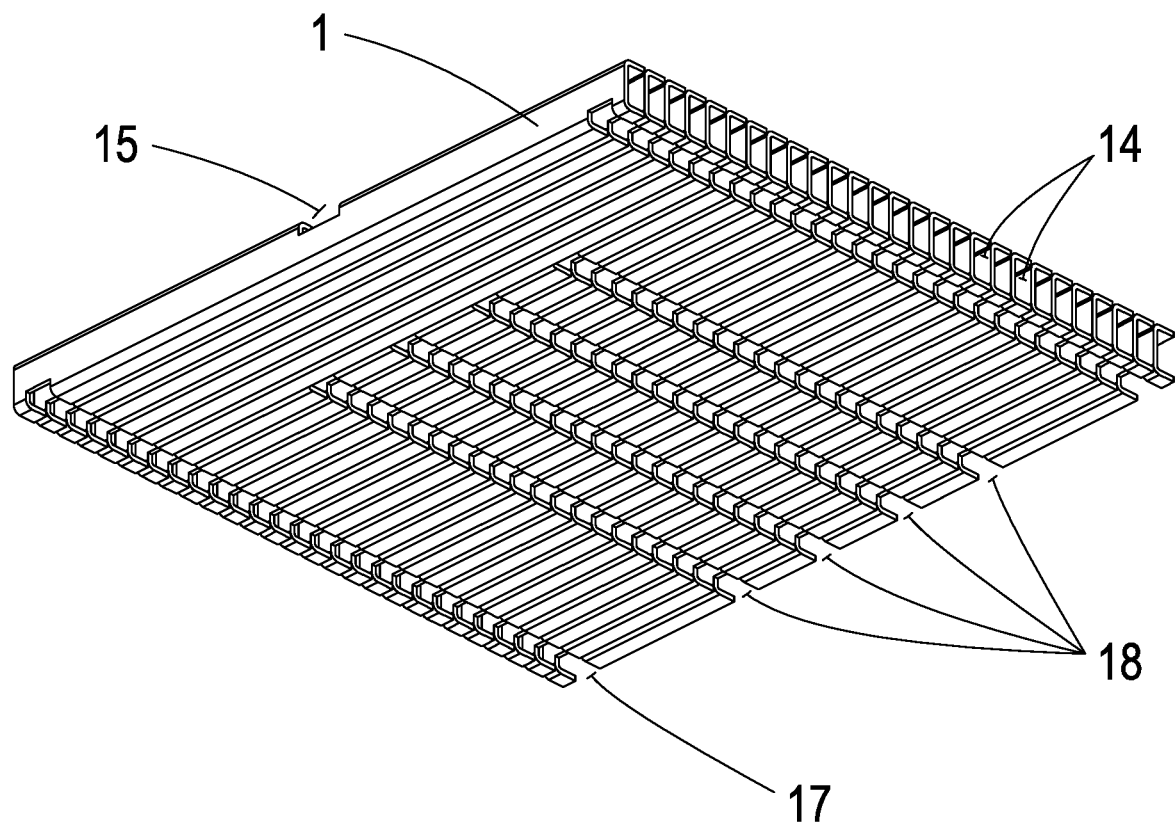
FIG. 2 is a perspective schematic view for a heat exchange component of an evaporator structure from another viewpoint.
Figure 3:
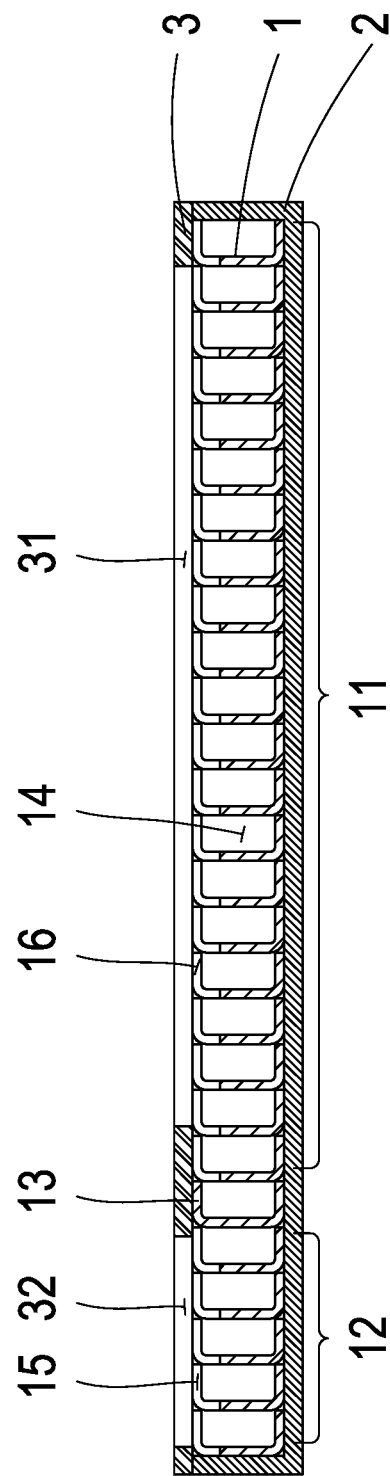
FIG. 3 is a cross-sectional schematic view of an evaporator structure.

Referring to FIG. 1 and FIG. 2, which are an exploded perspective schematic view of an evaporator structure and a perspective schematic view for a heat exchange component of an evaporator structure from another viewpoint, respectively. As shown in figures, an evaporator structure comprises a heat exchange component 1, a thermal conductive shell 2 and a top cap 3.

In an evaporator structure, the heat exchange component 1, which is either an integrated component or an assembled component, is divided into a steam region 11 and an inflow water region 12. The steam region 11 is greater than the inflow water region 12 in area. The steam region 11 and the inflow water region 12 are separated from each other by a partition wall 13 in between. The heat exchange component 1 comprises a plurality of parallel and penetrated transverse channels 14 inside. The inflow water region 12 has a lengthwise top water inlet channel 15 created near the top center and extending from one side of the inflow water region 12 to the partition wall 13. The steam region 11 has a plurality of lengthwise steam channels 16 near the top center (in the embodiment, there are one lengthwise top water inlet channel 15 and three lengthwise steam channels 16 in design). The lengthwise steam channel 16 extending from one side of the steam region 11 to the partition wall 13 is greater than the lengthwise top water inlet channel 15 in length. The lengthwise top water inlet channel 15 and the lengthwise steam channels 16 are not interconnected with each other due to a design of the partition wall 13 and the lengthwise top water inlet channel 15 (the lengthwise steam channels 16) is (are) perpendicular with the transverse channels 14.

The heat exchange component 1 comprises two first lengthwise cooling fluid channels 17 near two side edges at the bottom, respectively. The first lengthwise cooling fluid channel 17 penetrates lower portions of the steam region 11, the inflow water region 12 and the partition wall 13 as well as both bottom edges of the heat exchange component 1. The steam region 11 comprises a plurality of second lengthwise cooling fluid channels 18 near the lower center and each second lengthwise cooling fluid channel 18 extending from one side of the steam region 11 to the partition wall 13 is equal to each lengthwise steam channel 16 in length. The lengthwise top water inlet channel 15 and the inflow water region 12 are not interconnected with each other due to the partition wall 13 (in the embodiment, there are four second lengthwise cooling fluid channels 18 and two first lengthwise cooling fluid channels 17); the second lengthwise cooling fluid channels 18 are staggered with the lengthwise steam channels 16.

In an evaporator structure, the thermal conductive shell 2 is used to accommodate the heat exchange component 1.

In an evaporator structure, the top cap 3 covering the thermal conductive shell 2 comprises a steam outlet 31 and a water inlet 32 opened exteriorly wherein the steam outlet 31 and the water inlet 32 are opposite to one of the lengthwise steam channels 16 and the lengthwise top water inlet channel 15, respectively.

Generally, the thermal conductive shell 2 accommodates a certain quantity of cooling fluids A and steam B. As shown in the embodiment in FIGS. 4 and 5, the bottom of the thermal conductive shell 2 is fixed on a heat generation device 4 opposite to the steam region 11 of the heat exchange component 1. The top cap 3 is equipped with a cooling fin shield 5, a steam pipeline 6 and a cooling fluid pipeline 7 wherein both the steam pipeline 6 and the cooling fluid pipeline 7 are connected to a condenser 8. Accordingly, heat energy generated by the heat generation device 4 is transferred to inside of the thermal conductive shell 2 for delivery of created heat sources to the steam region 11 of the heat exchange component 1. When the temperature of heat accepted by the thermal conductive shell 2 reaches a default evaporating temperature, cooling fluids A in the transverse channels 14 and the second lengthwise cooling fluid channels 18 of the heat exchange component 1 are evaporated and converted to steam B. Through the transverse channels 14, the steam B is guided upwards and collected in the lengthwise steam channels 16 in which the steam B is decompressed for no excessive pressure concentrated in the thermal conductive shell 2. The steam B guided from the steam outlet 31 and the steam pipeline 6 is further transmitted to the condenser 8 in which the steam B is cooled and transformed to cooling fluids A. After steam evaporated from cooling fluids A is guided into the condenser 8, the pressure inside the heat exchange component 1 is reduced such that cooling fluids A are generated in the condenser 8 and returned to the heat exchange component 1 of an evaporator again through the cooling fluid pipeline 7.

Figure 4:
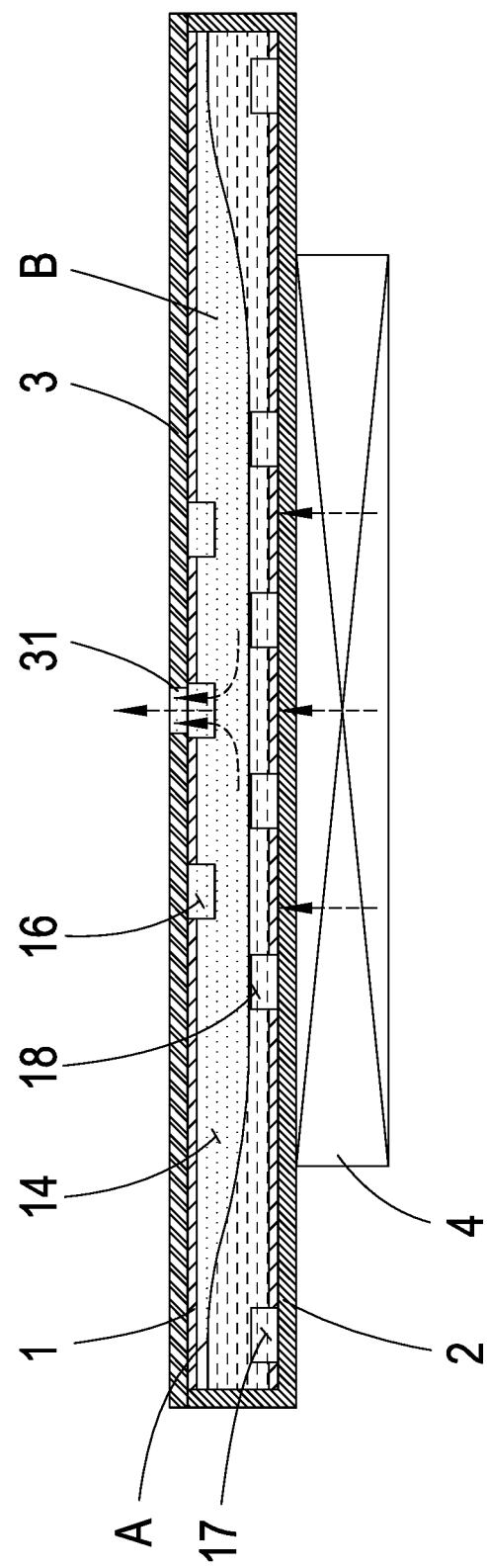
FIG. 4 is a cross-sectional schematic view of an evaporator structure in which both cooling fluids and steam are circulated.
Figure 6:
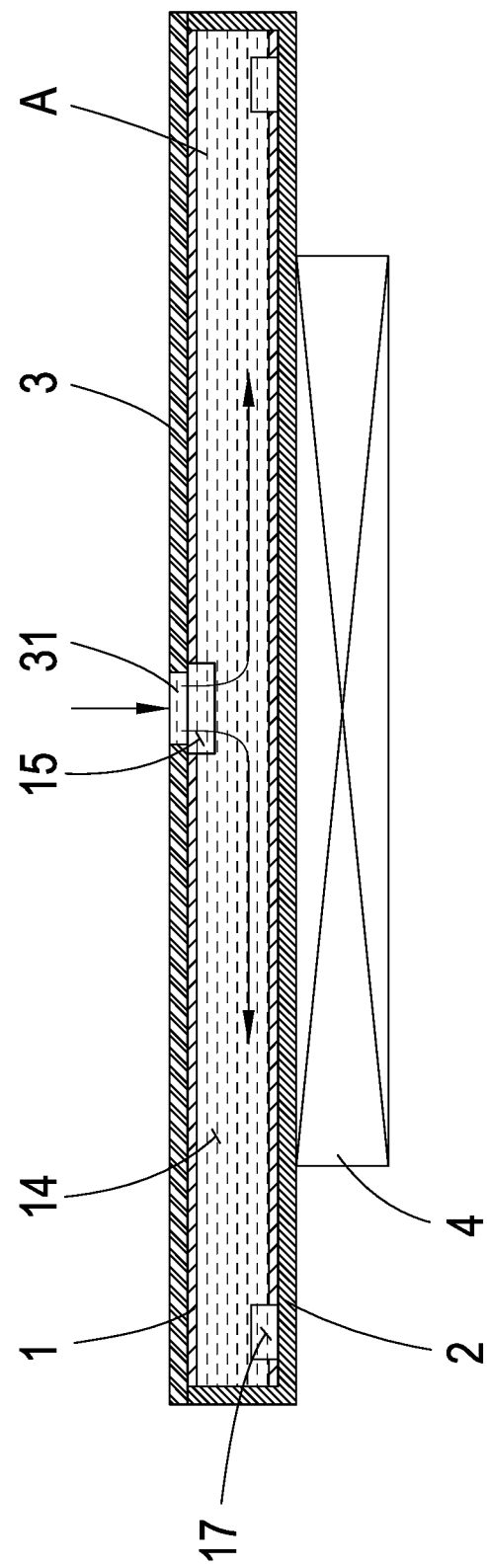
FIG. 6 is a cross-sectional schematic view of an evaporator structure in which cooling fluids are circulated.
Figure 7:
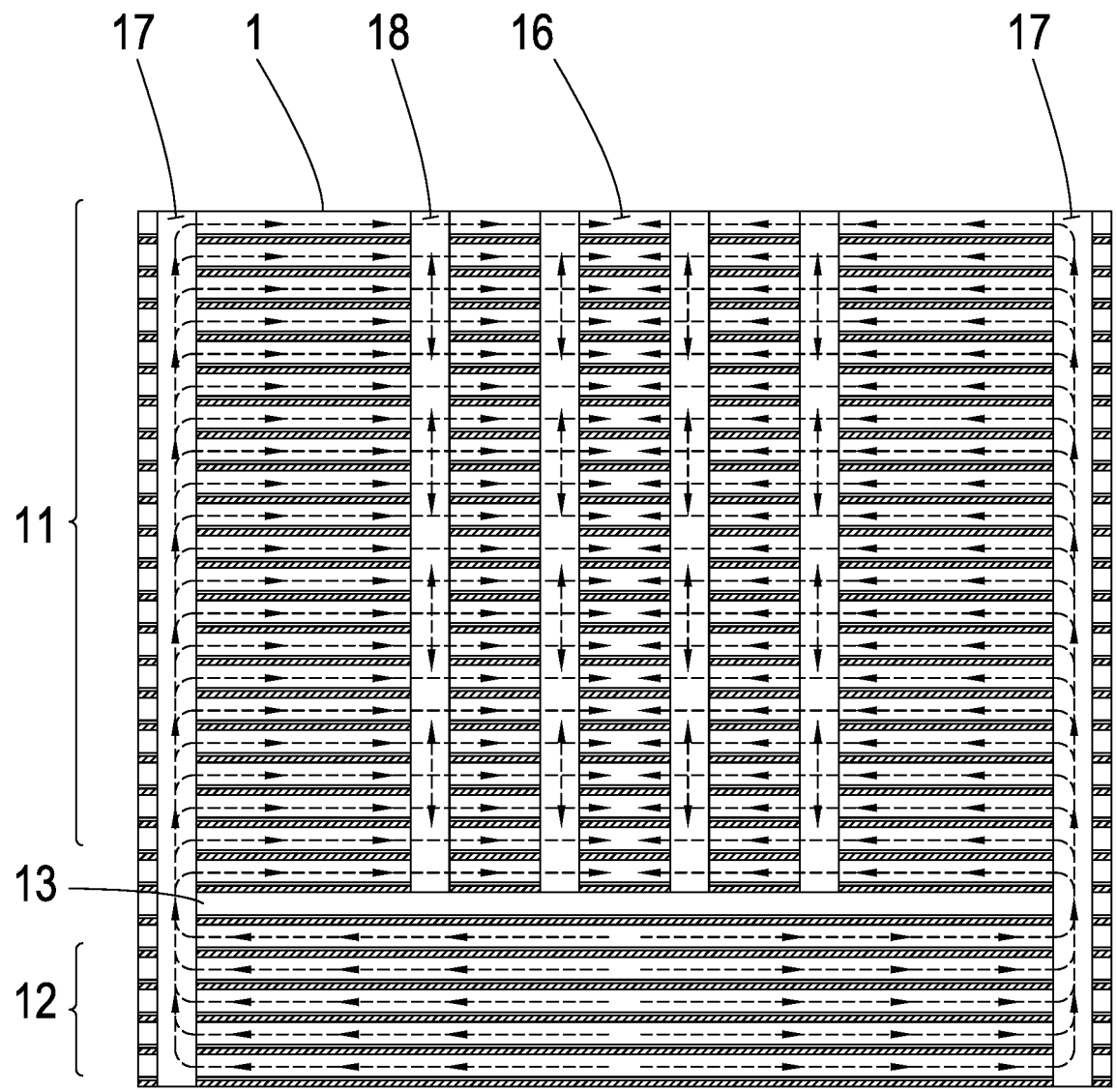
FIG. 7 is a plan view of an evaporator structure in which cooling fluids are circulated.

As shown in FIGS. 4, 6 and 7, the returned cooling fluids A pass through the water inlet 32 as well as the lengthwise top water inlet channel 15 and enter all transverse channels 14. Because the second lengthwise cooling fluid channels 18 and the lengthwise top water inlet channel 15 are not interconnected with each other, the cooling fluids A passing through the lengthwise top water inlet channel 15 and entering the transverse channels 14 flow to both sides for lengthwise movements under direction of the first lengthwise cooling fluid channels 17. Then, the cooling fluids A entering the transverse channels 14 flow to the second lengthwise cooling fluid channels 18 which guide the cooling fluids A toward heat sources generated by the heat generation device 4 transversely and lengthwise for neither sluggish cooling due to insufficient cooling fluids A nor abrupt temperature/pressure increases. Accordingly, the cooling fluids A guided into heat sources at the center from an outermost side via the first lengthwise cooling fluid channels 17 and the second lengthwise cooling fluid channels 18 contact all locations inside the heat exchange component 1 for heat dissipation. Moreover, the cooling fluids A contacting heat sources are evaporated again and converted to steam B which is guided upwards and enters the steam pipeline 6 and the condenser 8 sequentially through steam channels 16 and the steam outlet 31 for completion of a cooling cycle.

Accordingly, the cooling fluids A evaporated in the steam region 11 of the heat exchange component 1 are converted to steam B with which heat is transferred to the condenser 8; then, the steam B is condensed to cooling fluids A which is returned to the inflow water region 12 in the heat exchange component 1. In virtue of one partition wall 13 designed between the inflow water region 12 and the steam region 11, gas-liquid separation and automatic thermal cycling between actions of the cooling fluids A and the steam B inside the heat exchange component 1 separately are available.

Figure 5:
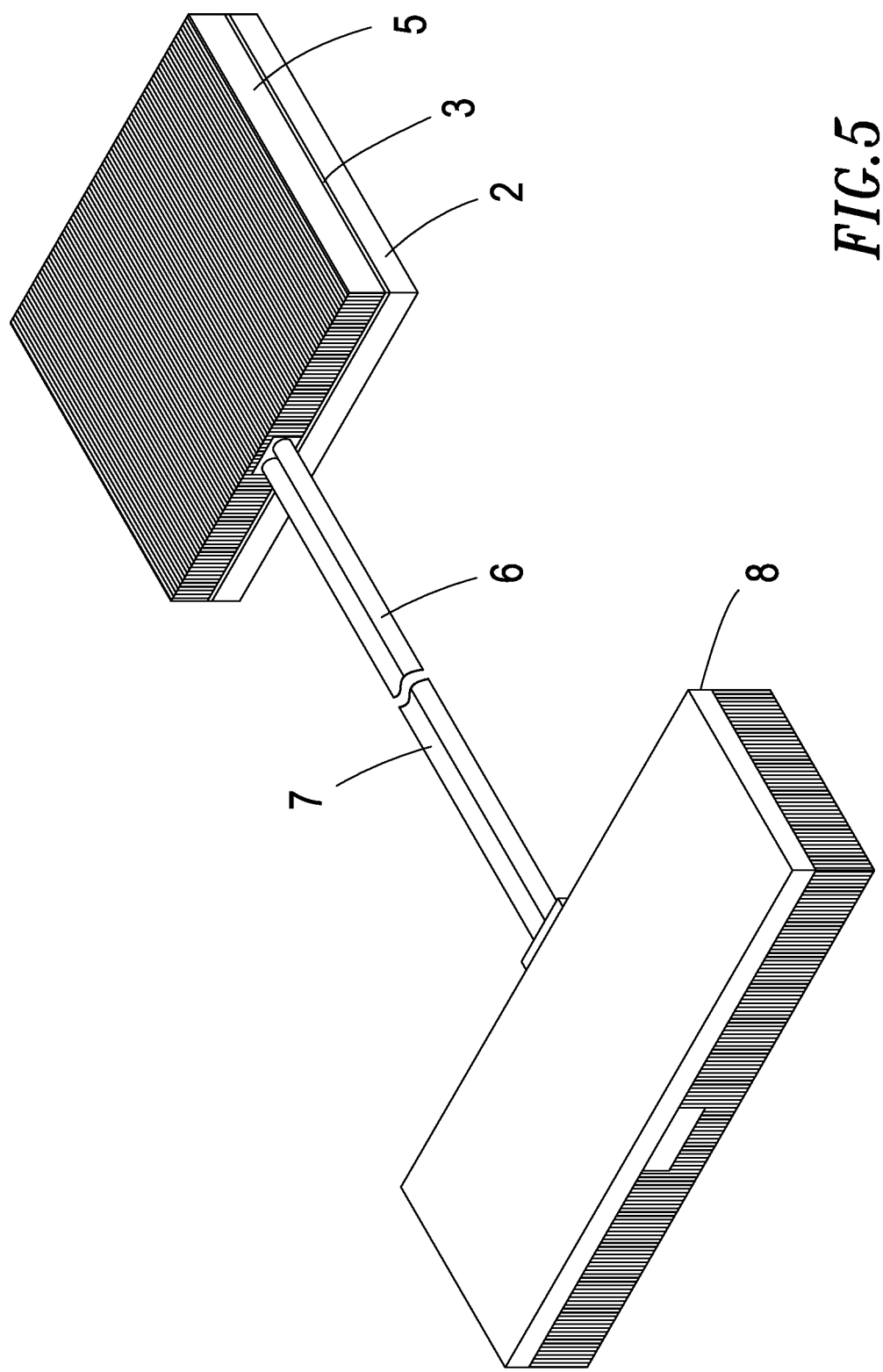
FIG. 5 is a perspective schematic view of an evaporator structure with which a condenser is integrated.

Furthermore, as shown in FIG. 5, the cooling fluids A circulate throughout the transverse channels 14 effectively for better heat dissipation due to the second lengthwise cooling fluid channels 18 staggered with the steam channels 16.

An evaporator structure provided in the present disclosure is characteristic of the layout of cooling fluid channels inside a heat exchange component and circulating paths of cooling fluids for promotion of heat dissipation due to following advantages:

(1) A heat exchange component provided in the present disclosure comprises an inflow water region and a steam region, both of which are interconnected with first lengthwise cooling fluid channels particularly. Accordingly, cooling fluids entering a lengthwise top water inlet channel are guided to both sides inevitably and further second lengthwise cooling fluid channels through transverse channels and returned to a steam region of the heat exchange component. That is, cooling fluids are circulated throughout both the inflow water region and the steam region in the heat exchange component uniformly based on a large contact area for effective full-area heat dissipation.

(2) A heat exchange component provided in the present disclosure comprises a plurality of second lengthwise cooling fluid channels at the bottom of the steam region particularly for reduced spacing between any two second lengthwise cooling fluid channels. Accordingly, the water levels of cooling fluids among the second lengthwise cooling fluid channels are equilibrated for no locally high temperature due to a specific low water level and a uniform pressure in the heat exchange component.

The preferred embodiments hereof are not taken as examples to restrict the scope of an evaporator structure in the present disclosure. Any brief or equivalent change/modification made by the skilled persons who familiarize themselves with the above technical features and embodiments without departing from the spirit and scope of the present disclosure should be covered in claims of the patent specification.

What is claimed is:

1. An evaporator structure, comprising:
a heat exchange component, which is divided into a steam region and an inflow water region and comprises a partition wall between the steam region and the inflow water region, a plurality of parallel and penetrated transverse channels situated on an interior of the evaporator structure, a lengthwise top water inlet channel adjacent the top center of the inflow water region, and a plurality of lengthwise steam channels adjacent the top center of the steam region wherein the lengthwise top water inlet channel and the lengthwise steam channels are not directly interconnected with each other due to the partition wall separating the lengthwise top water inlet channel and the lengthwise steam channels, the lengthwise top water inlet channel and the lengthwise steam channels are perpendicular with the transverse channels, the lower portions of the steam region, the inflow water region and the partition wall are penetrated by two first lengthwise cooling fluid channels situated at the bottom and adjacent two side edges of the heat exchange component respectively, the steam region comprises a plurality of second lengthwise cooling fluid channels situated at a central region at the bottom of the heat exchange component and featuring a length less than a length of any first lengthwise cooling fluid channels, and the second lengthwise cooling fluid channels are staggered with the lengthwise steam channels;
a thermal conductive shell in which the heat exchange component is accommodated;
a top cap covering the thermal conductive shell and comprising an opening for a steam outlet and an opening for a water inlet and the top cap being situated opposing a top side of the heat exchange component containing one of the lengthwise steam channels and the lengthwise top water inlet channel.

2. The evaporator structure as claimed in claim 1 wherein the heat exchange component is a single component.

3. The evaporator structure as claimed in claim 1 wherein the lengthwise steam channels and the second lengthwise cooling fluid channels of the heat exchange component are equal to each other in length.

4. The evaporator structure as claimed in claim 1 wherein the steam region is greater than the inflow water region in area.

5. The evaporator structure as claimed in claim 1 wherein the lengthwise steam channels adjacent the center of the steam region extend from one side edge of the two side edges to the partition wall, the lengthwise top water inlet channel extends from another side edge of the two side edges to the partition wall, and the lengthwise steam channels and the second lengthwise cooling fluid channels of the heat exchange component are not directly interconnected with each other due to the partition wall separating the lengthwise top water inlet channel and the lengthwise steam channels.

6. The evaporator structure as claimed in claim 1 wherein the second lengthwise cooling fluid channels adjacent the center of the steam region extend from one side edge of the two side edges to the partition wall, the lengthwise top water inlet channel extends from another side edge of the two side edges to the partition wall, and the lengthwise steam channels and the second lengthwise cooling fluid channels of the heat exchange component are not directly interconnected with each other due to the partition wall separating the lengthwise top water inlet channel and the lengthwise steam channels.

* * * * *